United States Patent [19]

Buol et al.

[11] Patent Number: 4,567,432
[45] Date of Patent: Jan. 28, 1986

[54] APPARATUS FOR TESTING INTEGRATED CIRCUITS

[75] Inventors: Douglas A. Buol, Dallas; Dean N. Mize; John W. Pattschull, both of Garland; Robert M. Wallace, Dallas, all of Tex.

[73] Assignee: Texas Instruments Incorporated, Dallas, Tex.

[21] Appl. No.: 490,001

[22] Filed: Jun. 9, 1983

[51] Int. Cl.[4] .................. G01R 1/06; G01R 31/26
[52] U.S. Cl. .................... 324/158 F; 324/158 P
[58] Field of Search ............ 324/158 F, 158 P, 23 PC

[56] References Cited

U.S. PATENT DOCUMENTS

| | | | |
|---|---|---|---|
| 3,702,439 | 11/1972 | McGahey et al. | 324/158 P |
| 3,710,251 | 1/1973 | Hagge et al. | 324/158 F |
| 3,963,986 | 6/1976 | Morton et al. | 324/158 F |
| 3,979,671 | 9/1976 | Meeker et al. | 324/158 F |
| 4,038,599 | 7/1977 | Bove et al. | 324/158 F |
| 4,488,111 | 12/1984 | Widdowson | 324/158 F |

FOREIGN PATENT DOCUMENTS 57-103062  6/1982  Japan ................ 324/158 P

Primary Examiner—Stewart J. Levy
Assistant Examiner—Stephen M. Baker
Attorney, Agent, or Firm—Richard A. Bachand; N. Rhys Merrett; Melvin Sharp

[57] ABSTRACT

A system for statically and dynamically testing an integrated circuit die in wafer form at various temperatures includes a multilayer support fixture in which the probes, the static test switching circuitry, and the dynamic test switching circuitry are mounted on separate, spaced apart, planar layers detachably connected to one another, the probe and the probe support board being formed of materials having a low temperature coefficient of thermal expansion. A heated/cooled wafer positioning chuck controls the temperature of the wafer thereon during static and dynamic testing.

10 Claims, 4 Drawing Figures

APPARATUS FOR TESTING INTEGRATED CIRCUITS

BACKGROUND OF THE INVENTION

The present invention relates generally to integrated circuit die testing and more particularly to apparatus for performing static and dynamic tests on integrated circuit devices at various temperatures.

Completed integrated circuit devices on a semiconductor wafer are subjected to a variety of tests to determine which devices function properly so that inoperative devices can be removed from further processing. It is not unusual for the cost of assembling and packaging the die to greatly exceed the cost of the die itself, especially in the case of high reliability devices. Therefore, significant savings in assembly, packaging and final testing can be achieved by screening out unacceptable devices immediately after wafer fabrication is completed.

The testing of a die on a completed wafer, or multiprobe testing, is generally performed at about 25° C. by coupling logic test signals to the inputs of the die and sensing the output signals to determine that the device switches properly. This is referred to as static or "DC" testing since low frequency logic input signals are used and the outputs are sensed after the device reaches a steady-state condition. While the static test is important in predicting whether a device will be operable following assembly and packaging, it does not insure that a completed device will pass a final test which simulates operation at normal operating frequencies and switching speeds. It is thus desirable to perform dynamic or "AC" tests to more accurately predict which die will pass a similar final test after completion. Dynamic testing includes the application of high speed logic signals to the die while sensing the outputs to measure operating parameters such as propagation delay times and swtiching speeds under predetermined load conditions.

The operability of a completed device at final test can be further insured by static and dynamic multiprobe testing of the die at elevated and lowered temperatures, for example, greater than about 70° C. and less than about 0° C. However, the accuracy and repeatability of high temperature tests are limited by the thermal effects on various components of the system. A typical probing system includes a plurality of extremely thin metallic probe mounted on a probe support such as a printed circuit board and arranged in a pattern identical to the contact areas on the die to be tested. The system further includes a semiconductor wafer chuck for positioning a wafer thereon to successively place each die into contact with the probes. A single probe is about 1 mil in diameter and must accurately contact an area on a die that is about 3 mils on the side. For most probes the angular positioning accuracy must be within about $\pm\frac{1}{4}°$.

The thermal expansion and contraction of the probes and the probe support causes movement of the probe tip, which in turn can cause the probes to intermittently lose contact with the die under test, or to move outside of the acceptable test area on the die surface. This probe movement can cause operable devices to be improperly rejected.

SUMMARY OF THE INVENTION p Accordingly, the present invention overcomes these and other disadvantages by providing apparatus for statically and dynamically testing an integrated circuit die in wafer form at high and low temperatures.

In one embodiment of the invention a multiprobe test system includes a multilayer support fixture in which the probe, the static test switching circuitry, and the dynamic test switching circuitry are mounted on separate, spaced apart, planar boards detachably connected to one another, the probe, the probe support and the probe board being formed of materials having a low temperature coefficient of thermal expansion.

In another embodiment, the temperature of a wafer positioning chuck is controlled to raise and/or lower the temperature of the wafer of thereon during static and dynamic testing.

It is therefore an object of the present invention to provide a static and dynamic integrated circuit die test system having improved thermal and mechanical stability.

Another object of the present invention is to provide a test system including means for varying the temperature of a die in wafer form during static and dynamic testing.

Yet another object of the present invention is to provide a die test system that is readily adaptable to a variety of integrated circuits.

BRIEF DESCRIPTION OF THE DRAWINGS

Other objects, advantages, and novel features of the invention will become apparent from the following detailed description of the invention when considered in conjunction with the accompanying drawings, wherein.

DESCRIPTION OF THE PREFERRED EMBODIMENTS

Figure 1:
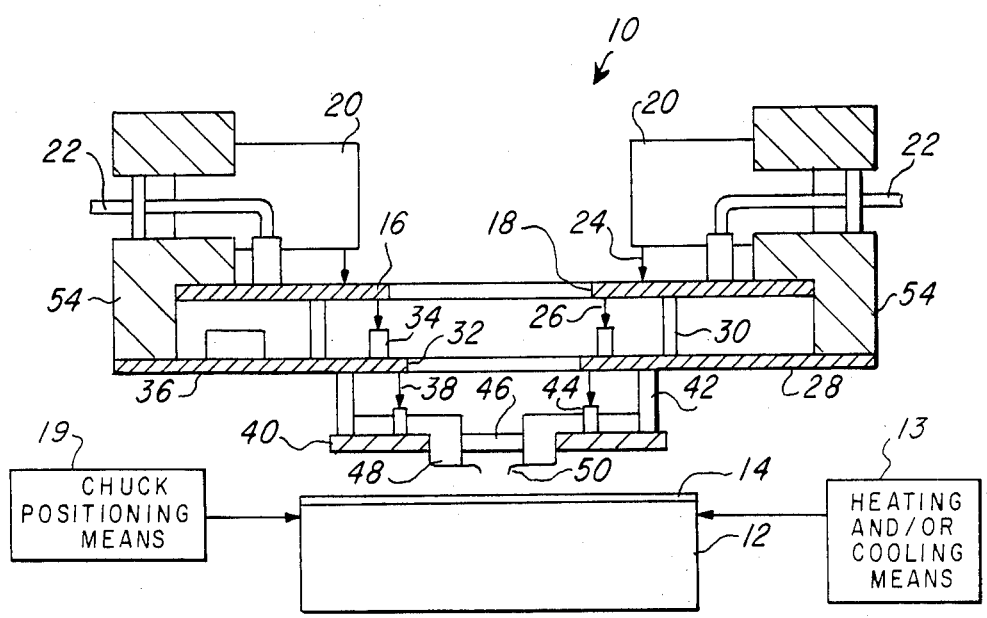
FIG. 1 is a cross-sectional view in elevation showing a multilayer test fixture according to one embodiment of the present invention.

Referring now to the drawings, there is shown in FIG. 1 a multilayer test fixture 10 according to one embodiment of the present invention. Test fixture 10 forms an integral part of a system for testing integrated circuit devices on a semiconductor wafer. The system further includes a wafer chuck 12 which holds a semiconductor wafer 14 in place on its upper surface for successively bringing each die in contact with the probes of test fixture 10. In the preferred embodiment wafer chuck 12 includes means 13 for heating and/or cooling wafer 14 to a predetermined temperature during testing, for example, an electricl heating element and refrigerant gas.

Figure 2:
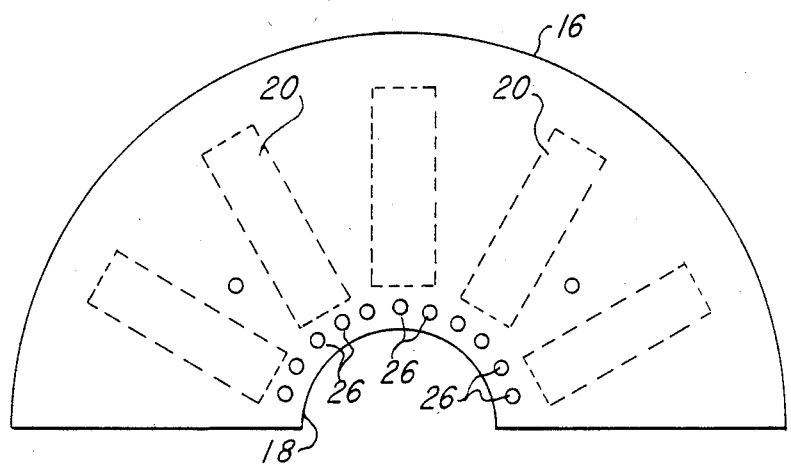
FIG. 2 is a bottom diagrammatic plan view of a portion of one layer of the test fixture of FIG. 1 including the dynamic test switching circuitry.

The first layer 16 of test fixture 10 is a planar annular circuit board having a centrally located opening 18 therethrough. Board 16 is formed of a low thermal expansion material with a laminated construction similar to that of conventional printed circuit boards. Affixed to the upper surface of board 16 are a plurality of high impedance isolation amplifiers 20, for example, FET probe followers, circumferentially located about opening 18, as best shown in FIG. 2. A low-loss input-/output conductor 22 is coupled through input/output switching circuitry (not shown) to the inputs of amplifiers 20. The input 24 of each amplifier 20 is coupled through board 16 to one of a plurality of connectors 26 affixed to the lower surface of board 16 and arranged peripherally about opening 18.

Figure 3:
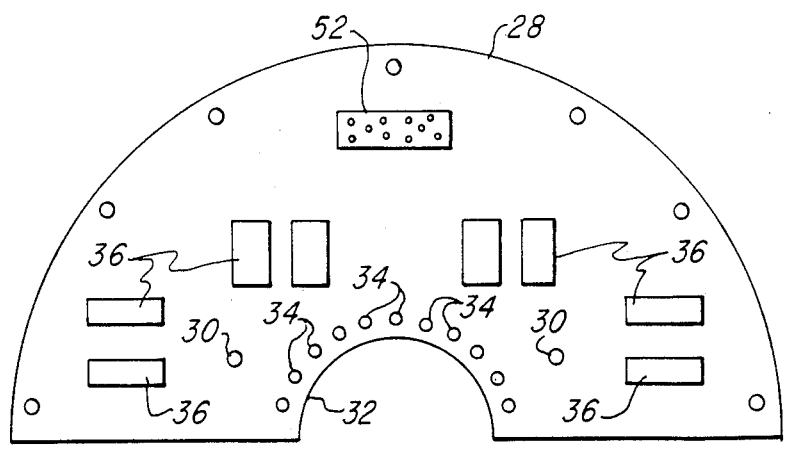
FIG. 3 is a top diagrammatic plan view of a second layer of the test fixture of FIG. 1 including static test switching circuitry.

The second layer 28 of test fixture 10 is a planar annular circuit board spaced apart from board 16 by a plurality of spacers 30 and having a centrally located opening 32 therethrough concentric with opening 18 in board 16. A plurality of connectors 34 are affixed to the upper surface of board 28 and arranged peripherally about opening 32 in a pattern identical to that of connectors 26 on the lower surface of board 16. Referring to FIG. 3, affixed to the upper surface of board 28 are a plurality of load devices 36 which are selectively coupled to connectors 34 by switching means (not shown). Connectors 34 are coupled to a plurality of connectors 38 affixed to the lower surface of board 28 and arranged in a similar pattern. Board 28 is formed, for example, of an epoxy-fiberglass material similar to the structure of board 16.

A third board 40 of test fixture 10 is spaced apart from the lower surface of board 28 by a plurality of spacers 42. Affixed to the upper surface of board 40 are a plurality of connectors 44 arranged about the periphery of a centrally located opening 46 through board 40, the connectors 44 being arranged in an identical pattern to the connectors 38 extending from the lower surface of board 28. The concentric openings 18, 32 and 46 permit visual observation of the die under test for alignment and inking. Also affixed to the upper surface of board 40 are a plurality of probe supports 48 circumferentially arranged about and extending radially into opening 46. A conducting probe 50 is affixed to each probe support 48 and is connected at one end to one of the connectors 44, the other end of each probe 50 extending below the lower surface of board 40. The probes 50 are arranged in a predetermined configuration corresponding to the inputs and outputs, i.e., the bond pads, of a selected die on wafer 14 to be tested. In operation, wafer chuck 12 is positioned by positioning means 19 so that the die under test is located beneath probes 50. The wafer chuck 12 is then elevated to bring the die into contact with the probes. It will be apparent that the present test fixture provides an extremely short conductor path between the inputs of the isolation amplifiers 20 and probes 50. This significantly reduces noise and other undesirable effects which can induce errors in a dynamic test. FIG. 2 is a view of the lower surface of board 16 showing the connector 26 layout and the arrangement of isolation amplifiers 20.

Referring now to FIG. 3, there is shown the upper surface of board 28 which more clearly illustrates the arrangement of connectors 34. A connector 52 disposed near the periphery of board 28 provides an input/output for the steady state test signals which are selectively coupled by switching means (not shown) to selected connectors 34. The arrangement of the load means 36 on board 28 enables a variety of similar devices to be tested without changing the load board 28. Only board 40, the probe board, need be changed to adapt the test system to a particular integrated circuit pinout.

Figure 4:
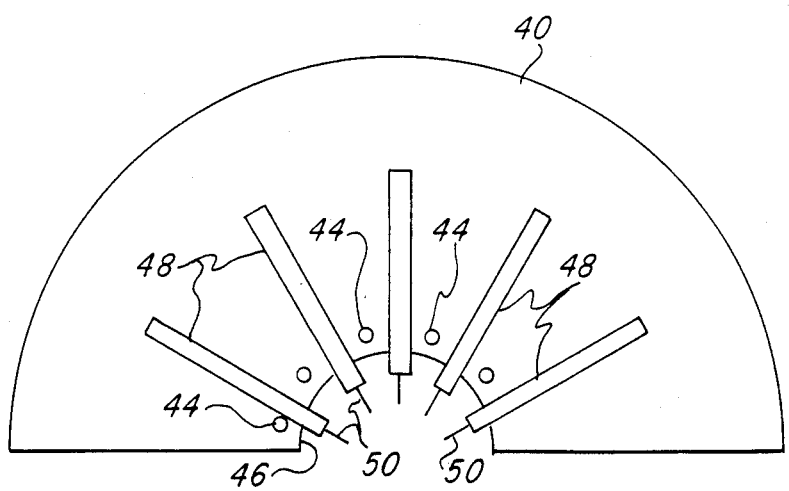
FIG. 4 is a top diagrammatic plan view of a portion of the third layer of the test fixture of FIG. 1 showing the probe supports and probes affixed thereto.

FIG. 4 shows a plan view of a portion of the upper surface of probe board 40. Connectors 44, which are coupled to connectors 38 on the lower surface of board 28, are disposed about the periphery of opening 46 and provide conductive paths to associated probes 50 which are affixed to probe supports 48. Boards 16, 28 and 40 are preferably relatively thick to resist flexure and are formed of a material having a low temperature coefficient of thermal expansion, for example, a polyimide/-glass laminated structure. In addition to their thermal expansion properties, polymide resins exhibit excellent heat resistance without being brittle. One particularly useful polyimide, based on the reaction of a bismaleimide and an aromatic diamine, is described in an article by J. C. Zeroth entitled: "Polyimide Materials: Gaining Ground", *Electronic Packaging and Production,* July 1981, pp. 113–123, incorporated herein by reference. It is also preferable that probe support 48 and probes 50 be formed of materials having a low coefficient of thermal expansion. For example, probe supports 48 may be formed of ceramic and probes 50 may be formed of tungsten, a tungsten alloy such as platinum-tungsten, or beryllium-copper.

Referring again to FIG. 1, boards 16 and 28 of test fixture 10 are peripherally affixed to a rigid annular support 54. This improves the structural integrity of layers 16 and 28 and diminishes the effect of vibration on probes 50. The separation of probe board 40 from load board 28 and board 16 allows semiconductor wafer 14 to be heated to over 100° C. and cooled to less than 0° C. during both static and dynamic testing without significantly affecting the temperature of boards 28 and 16 or the electric components thereon. This arrangement also provides a stable mechanical support for probes 50 on the device under test.

Thus, the present invention provides a multilayer, miltiprobe test fixture which permits high and low temperature static and dynamic testing of integrated circuit die in wafer form, therefore allowing improved yield and throughput in a mass production environment.

Obviously many modifications and variations of the present invention are possible in the light of the above teachings. For example, probe board 40 may easily be replaced by a board including a socket compatible with a completed integrated circuit device. In this manner, the final test results of the completed device may be directly compared to the results of the die at multiprobe. It is therefore to be understood that within the scope of the appended claims, the invention may be practiced otherwise than is specifically described herein.

What is claimed is:

1. Apparatus for testing integrated circuits on a semiconductor wafer, comprising:

a first planar support having upper and lower surfaces with a centrally located first opening therethrough at least as large as an integrated circuit to be tested for visual observation of the integrated circuits on the wafer and including a plurality of first connectors affixed to the upper and lower surfaces thereof peripherally about said first opening;

a second planar support having an upper surface spaced from the lower surface of said first support and having a centrally located second opening therethrough concentric with said first opening at least as large as an integrated circuit to be tested for visual observation of the integrated circuits on the wafer, said second planar support including a plurality of second connectors affixed to the upper surface thereof and located peripherally about said second opening, said second connectors being detachably coupled to said first connectors and thermally and mechanically isolated from said first support;

a plurality of probe supports affixed to the upper surface of said second support at the periphery of said second opening and extending radially inwardly therefrom;

a plurality of probes each affixed to a respective one of said plurality of probe supports and each having one end connected to a respective one of said plurality of second connectors, and the other end extending through said second opening below the lower surface of said second support to form a predetermined probe configuration;

means for positioning each integrated circuit of the semiconductor wafer so that predetermined locations of said integrated circuits are successively brought into contact with said plurality of probes;

a third planar support spaced apart from the upper surface of said first support and having a centrally located third opening therethrough concentric with said first and second openings, at least as large as an integrated circuit to be tested for visual observation of the integrated circuits, including a plurality of third connectors affixed to upper and lower surfaces thereof peripherally about said third opening, said lower surface third connectors being connected to said upper surface second connectors and being thermally and mechanically isolated from said first and second supports; and means associated with said first, second, and third planar support means and said integrated circuit positioning means for thermally isolating said integrated circuits to enable said integrated circuits to be heated to about 100° C. and cooled to about 0° C. without affecting the temperature of said first, second and third planar support means.

2. The apparatus of claim 1, wherein said positioning means includes means for controlling the temperature of said semiconductor wafer.

3. The apparatus of claim 2, further comprising:
means affixed to said first support means for selectively coupling first test signals to selected first connector means.

4. The apparatus of claim 3, further comprising:
means affixed to said third support means for selectively coupling second test signals to selected third connector means.

5. The apparatus of claim 4, wherein said first test signals comprise steady-state logic signals and said second test signals comprise high speed dynamic logic signals.

6. the apparatus of claim 5 wherein said second test signal coupling means includes isolation amplifier means coupled to each of said plurality of third connector means.

7. The apparatus of claim 6 wherein said second support means, said probe support means, and said probe means are formed of materials having a low temperature coefficient of thermal expansion over a temperature range of between about 100° C. and 0° C.

8. The apparatus of claim 7 wherein each of said second support means is formed of a polyimide resin.

9. The apparatus of claim 8 wherein said probe support means is formed of ceramic.

10. The apparatus of claim 9 wherein said probe means are formed of tungsten or a tungsten alloy.

* * * * *